United States Patent
Kanakasabapathy et al.

(10) Patent No.: US 8,394,684 B2
(45) Date of Patent: Mar. 12, 2013

(54) STRUCTURE AND METHOD FOR STRESS LATCHING IN NON-PLANAR SEMICONDUCTOR DEVICES

(75) Inventors: Sivananda K. Kanakasabapathy, Niskayuna, NY (US); Hemanth Jagannathan, Guilderland, NY (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 291 days.

(21) Appl. No.: 12/841,408

(22) Filed: Jul. 22, 2010

(65) Prior Publication Data
US 2012/0018730 A1  Jan. 26, 2012

(51) Int. Cl.
*H01L 21/84* (2006.01)
(52) U.S. Cl. ........ 438/149; 438/151; 438/157; 438/166; 257/E21.411; 257/E29.275
(58) Field of Classification Search ........... 438/149, 438/151, 157, 166; 257/E21.411, E29.275
See application file for complete search history.

(56) References Cited

U.S. PATENT DOCUMENTS
2007/0120154 A1*  5/2007  Zhu et al. ............ 257/288

* cited by examiner

*Primary Examiner* — Long Tran
(74) *Attorney, Agent, or Firm* — Scully, Scott, Murphy & Presser, P.C.; Louis J. Percello, Esq.

(57) ABSTRACT

Techniques are discloses to apply an external stress onto the source/drain semiconductor fin sidewall areas and latch the same onto the semiconductor fin before releasing the sidewalls for subsequent salicidation and contact formation. In particular, the present disclosure provides methods in which selected portions of a semiconductor are subjected to an amorphizing ion implantation which disorients the crystal structure of the selected portions of the semiconductor fins, relative to portions of the semiconductor fin that is beneath a gate stack and encapsulated with various liners. At least one stress liner is formed and then stress memorization occurs by performing a stress latching annealing. During this anneal, recrystallization of the disoriented crystal structure occurs. The at least one stress liner is removed and thereafter merging of the semiconductor fins in the source/drain regions is performed.

17 Claims, 10 Drawing Sheets

10

STRUCTURE AND METHOD FOR STRESS LATCHING IN NON-PLANAR SEMICONDUCTOR DEVICES

BACKGROUND

The present disclosure relates to semiconductor structures and methods of fabricating the same. More particularly, the present disclosure relates to multi-gated fully depleted non-planar semiconductor devices, such as, for example, finFETs, having a stressed channel caused by stress memorization. The present disclosure also provides methods of fabricating such non-planar semiconductor devices.

A multi-gated transistor is a metal oxide semiconductor field effect transistor (MOSFET) in which a gate electrode is placed on two or three sides of a channel or is wrapped around the channel, with a gate dielectric separating the gate electrode and the channel. A double gate finFET utilizes a double gate configuration in which the gate electrode is placed on two opposite sides of the channel. In a triple gate FET, the gate electrode is placed on one more side of a typically rectangular channel of the transistor. In a quadruple gate EET or a wrapped gate FET or a surround gate FET, the gate electrode is placed on four sides of the channel. The thin, undoped channel of a finFET device enhances the controllability of the finFET channel compared to a planar bulk MOSFET device or a PDSOI MOSFET device. The improved control of the channel allows smaller device dimensions with less short channel effects as well as larger electrical current that can be switched at high speeds. A finFET device has faster switching times, equivalent or higher current density, and much improved short channel control than mainstream complementary metal oxide semiconductor (CMOS) technology utilizing similar critical dimensions.

In a typical finFET structure, at least one horizontal channel on a vertical sidewall is provided within a semiconductor "fin" that is set sideways, or edgewise, upon a substrate. Typically, the fin comprises a single crystalline semiconductor material with a substantially rectangular cross-sectional area. The height of the fin, which fixes the device width, is typically greater than the width of the fin to enable higher on-current per unit area of semiconductor used for the finFET structure. In order to obtain desirable control of short channel effects (SCEs), the semiconductor fin is made thin enough in a device channel region to ensure forming fully depleted semiconductor devices. Typically, the thickness, or the horizontal width, of a fin in a finFET is less than two-thirds of its gate length in order to obtain good control of the short channel effects.

An inverted U-shaped gate electrode often straddles a central section of the semiconductor fin and covers the gate dielectric layer. In a typical double gate finFET, a gate dielectric layer and a gate conductor are located upon each of the two semiconductor fin sidewalls facing each other. A hard mask of substantial thickness is typically located between the top surface of the fin and the top portion of the inverted U-shaped gate electrode such that the top surface of the fin is not controlled directly by the portion of the gate electrode above it. In a typical triple gate finFET, a gate electrode of an inverted U shape is typically located upon the two semiconductor fin sidewalls and also upon the top surface of the fin structure. The top surface of the fin is separated from the top portion of the gate electrode only by a gate dielectric layer and is thus controlled by the gate electrode.

Doping is performed by techniques such as ion implantation or dopant diffusion on the source and drain regions, which are the end portions of the semiconductor fin, to deliver halo, extension, and source/drain doping while using the gate electrode or other masking layer as a mask on the channel region of the device.

Such three-dimensional geometry, which is provided by multi-gated fully depleted non-planar semiconductor devices, and the need for continued external resistance ($R_{ext}$) scaling necessitate merging of the source/drain regions by growing an epitaxial semiconductor layer on the source/drain regions, or some other intimate electrical contact to the fin sidewalls. However, this same piece of real estate has competing claims for a stress liner in order to modulate the strain parallel and along the channel.

BRIEF SUMMARY

Techniques are disclosed to apply an external stress onto the source/drain semiconductor fin sidewall areas and latch the same onto the semiconductor fin before releasing the sidewalls for subsequent salicidation and contact formation. In particular, the present disclosure provides methods in which selected portions of each semiconductor fin are subjected to a partial amorphization ion implantation which disorients the crystal structure of the selected portions of the semiconductor fins, relative to a portion of each of the semiconductor fins that is beneath a gate stack and encapsulated with various liners. At least one stress liner is formed and then stress memorization occurs by performing a stress latching annealing. During this anneal, solid phase epitaxial regrowth of the disoriented crystal structure occurs. The at least one stress liner is then removed and thereafter merging of each of the recrystallized portions of the semiconductor fins in the source/drain regions is performed.

In one aspect of the present disclosure, a method of fabricating a fully depleted non-planar semiconductor structure is provided. The method includes forming a plurality of parallel oriented semiconducting fins on a surface of a semiconductor substrate. A gate stack is located on a portion of each of the semiconductor fins that are formed. At least one liner is formed on at least an upper surface of the gate stack thus encapsulating underlying portions of each of the semiconductor fins. An amorphizing ion implantation process is performed in sidewall portions of the semiconductor fin that are adjacent the gate stack in which the source/drain regions will be formed. After the amorphizing ion implantation process, the amphorized portions of each of the semiconductor fins within the source/drain regions will have a disoriented crystal structure. The method also includes forming at least one stress inducing liner on exposed surfaces of each of the semiconductor fins and atop the at least one liner. The presence of the at least one stress inducing liner imparts a stress to a channel region of each of the semiconductor fins that is located beneath the gate stack. A stress latching annealing is performed after forming the at least one stress inducing liner. The anneal permanently transfers the stress from the at least one stress inducing liner into the channel region of each semiconductor fins, while simultaneously recrystallizing (by solid phase epitaxial regrowth) the disoriented crystal structure in portions of each of the semiconductor fins in which the source/drain regions will be subsequently formed. The at least the one stress inducing liner is removed and thereafter those portions of the semiconductor fin that are recrystallized are merged.

In another aspect of this disclosure, a multi-gated fully depleted non-planar semiconductor device is provided. The multi-gated fully depleted non-planar semiconductor device includes a plurality of semiconductor fins located on a surface of a semiconductor substrate. A gate stack is located on a portion of each of the semiconductor fins, wherein the semiconductor fin located beneath the gate stack has a stress memorized channel region that has a first strained crystal structure. An epitaxial semiconductor layer is located on other portions of each of the semiconductor fins, wherein the semiconductor fins beneath the epitaxial semiconductor layer have a second strained crystal structure that is different from the first strained crystal structure.

DETAILED DESCRIPTION

Figure 1A:
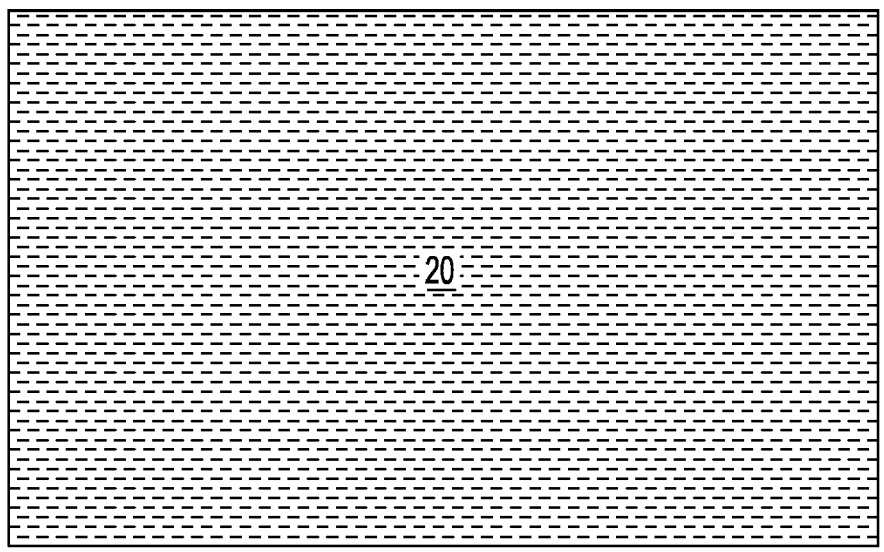
FIGS. 1A-1B are pictorial representations (through a top-down view and a cross sectional view, respectively) depicting an initial structure that can be employed in one embodiment of the present disclosure.

The present disclosure, which provides various methods for stress latching in multi-gated fully depleted non-planar semiconductor devices and a structure formed by the methods, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present disclosure provides techniques to apply an external stress onto the source/drain semiconductor fin sidewall areas and latch the same onto the semiconductor fin before releasing the sidewalls for subsequent salicidation and contact formation. In particular, the present disclosure provides methods in which selected portions of each semiconductor fin are subjected to an amorphizing ion implantation which disorients the crystal structure of the selected portions of the semiconductor fins, relative to a portion of each of the semiconductor fins that is beneath a gate stack and encapsulated with various liners. At least one stress liner is formed and then stress memorization occurs by performing a stress latching annealing. During this anneal, recrystallization (by solid phase epitaxial regrowth) of the disoriented crystal structure occurs. The at least one stress liner is removed and thereafter merging of each of the recrystallized portions of the semiconductor fins in the source/drain regions is performed.

Reference is now made to FIGS. 1A, 1B, 2A, 2B and 3-9 which illustrate a first embodiment of the present disclosure. The first embodiment of the present disclosure is also depicted in the flow diagram shown in FIG. 10. This first embodiment of the present disclosure begins by providing the initial structure 10 shown in FIGS. 1A-1B; in FIG. 10 this step is labeled as step 100.

Specifically, the initial structure 10 includes a semiconductor substrate 12 having a hard mask 20 located on an upper surface thereof. In one embodiment, and as shown in the drawings, the semiconductor substrate 12 includes a semiconductor-on-insulator substrate (SOI). In another embodiment (not shown), the semiconductor substrate 12 is a bulk semiconductor material.

When an SOI substrate is employed, the SOI substrate includes a handle substrate 14, a buried insulating layer 16 located on an upper surface of the handle substrate 14, and a semiconductor layer 18 located on an upper surface of the buried insulating layer 16.

The handle substrate 14 and the semiconductor layer 18 may comprise the same, or different, semiconductor material. The term "semiconductor" as used herein in connection with the semiconductor material of the handle substrate 14 and the semiconductor layer 18 denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 14 and the semiconductor layer 18. In one embodiment, the handle substrate 14 and the semiconductor layer 18 are both comprised of Si. In another embodiment, hybrid SOI substrates are employed which have different surface regions of different crystallographic orientations.

The handle substrate 14 and the semiconductor layer 18 may have the same or different crystal orientation. For example, the crystal orientation of the handle substrate 14 and/or the semiconductor layer 18 may be {100}, {110}, or {111}. Other crystallographic orientations besides those specifically mentioned can also be used in the present disclosure. The handle substrate 14 and/or the semiconductor layer 18 of the SOI substrate may be a single crystalline semiconductor material, a polycrystalline material, or an amorphous material. Typically, at least the semiconductor layer 18 is a single crystalline semiconductor material.

The buried insulating layer 16 of the SOI substrate may be a crystalline or non-crystalline oxide or nitride. In one embodiment, the buried insulating layer 16 is an oxide. The buried insulating layer 16 may be continuous, as shown, or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer 18 to a layer having a thickness that is more desirable.

The thickness of the semiconductor layer 18 of the SOI substrate is typically from 100 Å to 1000 Å, with a thickness from 200 Å to 700 Å being more typical. If the thickness of the semiconductor layer 18 is not within the above mentioned range, a thinning step such as, for example, planarization or etching can be used to reduce the thickness of the semiconductor layer 18 to a value within the range mentioned above. If thinning is to be employed, it is performed prior to forming the hard mask 20 on an upper surface of semiconductor substrate 12, i.e., an upper surface of the semiconductor layer 18.

The buried insulating layer 16 of the SOI substrate typically has a thickness from 10 Å to 2000 Å, with a thickness from 1000 Å to 1500 Å being more typical. The thickness of the handle substrate 14 of the SOI substrate is inconsequential to the present disclosure.

Figure 1B:
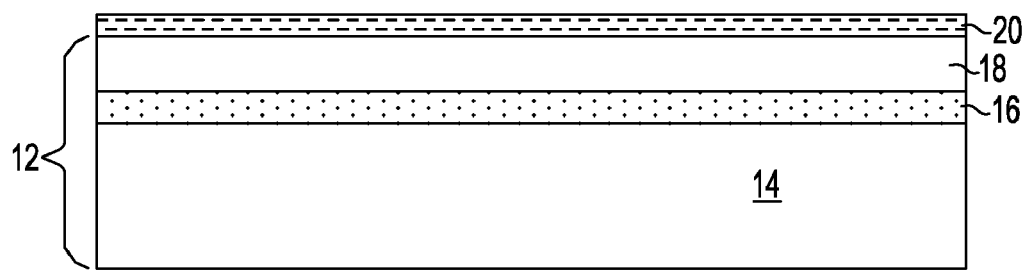

FIGS. 1A-1B also show the presence of a hard mask 20 on an uppermost surface of the semiconductor substrate 12. The hard mask 20 can be formed utilizing a conventional deposition process such as, for example, chemical vapor deposition (CVD), plasma enhanced chemical vapor deposition (PECVD), chemical solution deposition, evaporation or other like deposition processes. Alternatively, the hard mask 20 can be formed by a thermal process such as, for example, oxidation or nitridation. Any combination of the above mentioned processes can also be used in forming the hard mask 20.

The hard mask 20 comprises an oxide, nitride, oxynitride or any combination thereof including multilayers. In one embodiment, the hard mask 20 is an oxide including, for example, silicon oxide or silicon nitride. The thickness of the hard mask 20 may vary depending on the technique used in forming the same, the material of the hard mask itself, and the number of layers within the hard mask layer. Typically, the hard mask 20 has a thickness from 200 Å to 800 Å, with a thickness from 300 Å to 600 Å being more typical.

Figure 2A:
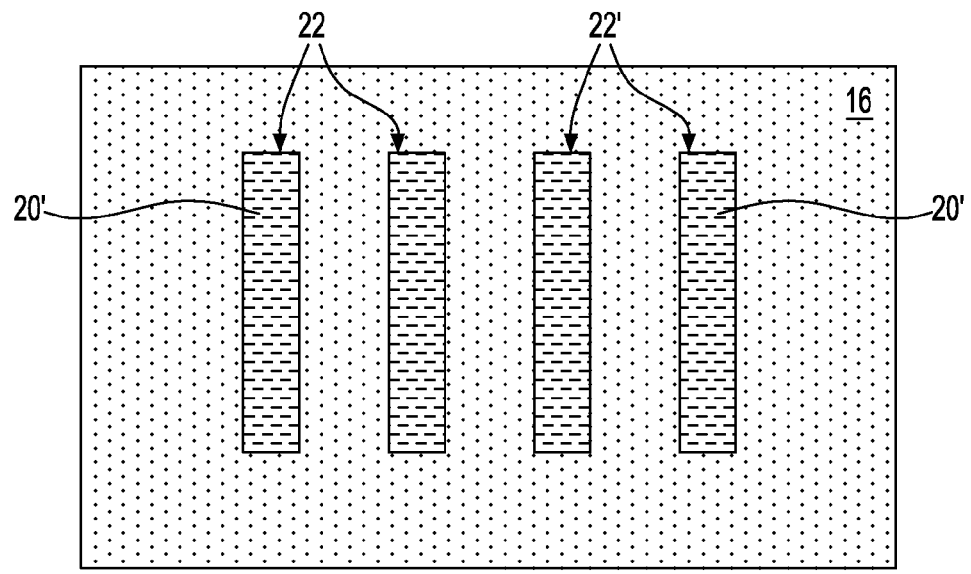
FIGS. 2A-2B are pictorial representations (through a top-down view and a cross sectional view, respectively) depicting the initial structure of FIGS. 1A-1B after forming a plurality of semiconductor fins (i.e., semiconductor bodies) on a surface of a substrate.
Figure 2B:
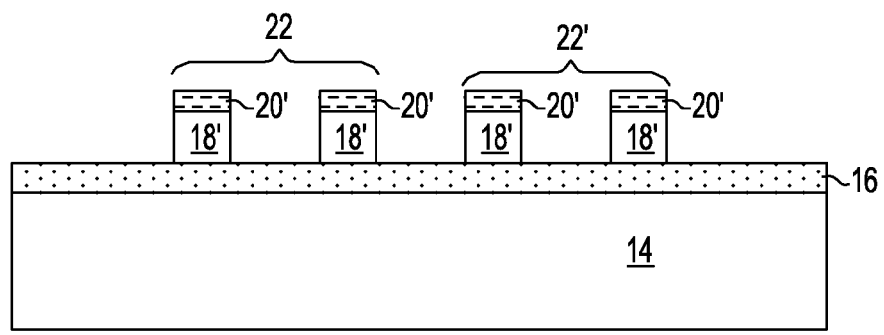
Figure 10:
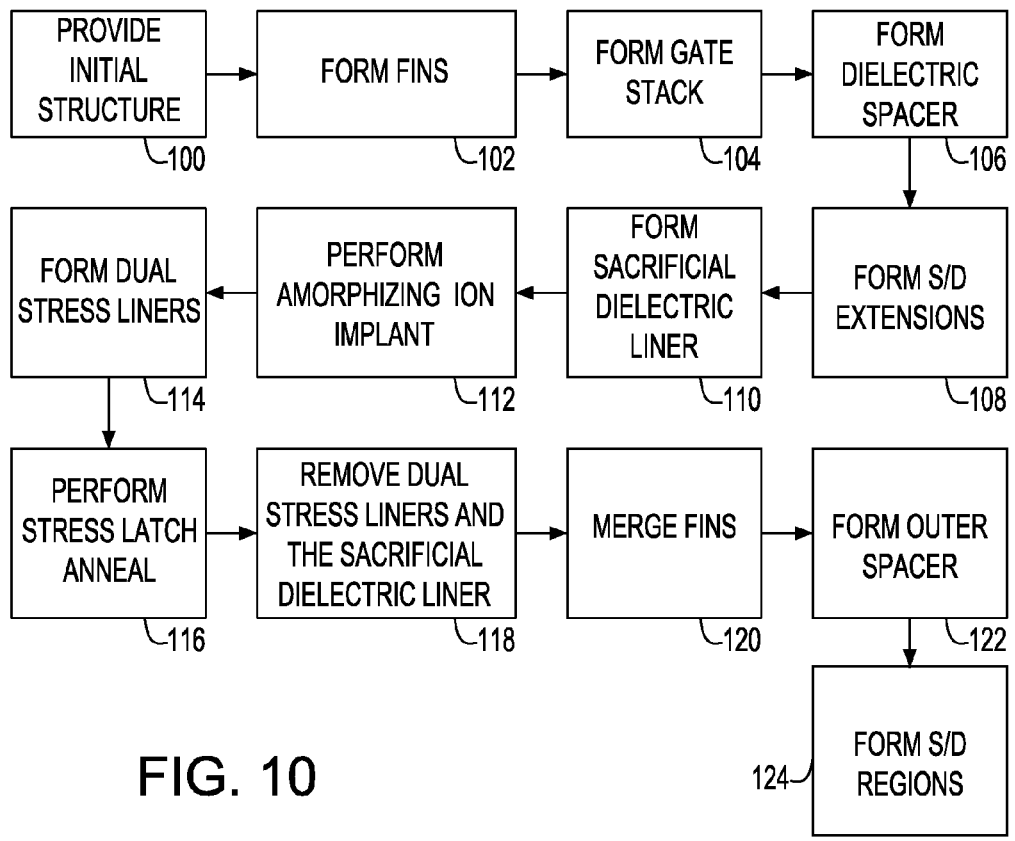
FIG. 10 is a flow diagram depicting the basic processing steps in accordance with the first embodiment which is shown in FIGS. 1A, 1B, 2A, 2B and 3-9.

Referring now to FIGS. 2A-2B, there is shown the structure of FIGS. 1A-1B after forming a plurality of parallel oriented semiconducting bodies which extend from a surface of the semiconductor substrate 12; this step is referenced by step 102 in FIG. 10. It is noted that each of the parallel oriented semiconducting bodies thus formed has a narrow width on the order of 20 nm or less and, a vertical thickness that is within the range provided above. As such, the semiconducting bodies that are formed are referred hereinafter as semiconductor fins. The plurality of semiconductor fins may be used as semiconductor bodies for n-type finFET devices, p-type finFET devices, or a combination of n-type finFET devices and p-type finFET devices. In the drawings, the semiconductor fins designated as 22 are used as semiconductor bodies for n-type finFET devices, while the semiconductor fins designated as 22' are used as semiconductor bodies for p-type finFET devices. Each semiconductor fin 22, 22' includes a remaining non-etched portion of semiconductor layer (in the drawings 18' denotes the remaining non-etched portion of the semiconductor layer) and a remaining non-etched portion of the hard mask (in the drawings 20' denotes the remaining non-etched portion of the hard mask 20). In some embodiments, no remaining etched portion of the hard mask is located atop the remaining non-etched portion 18' of the semiconductor layer 18.

In one embodiment, each of the semiconductor fins 22, 22' can be formed by lithography and etching. The lithographic step includes applying a photoresist (not shown) atop the hard mask 20, exposing the photoresist to a desired pattern of radiation, and developing the exposed resist utilizing a conventional resist developer. The etching process comprises dry etching and/or wet chemical etching. Illustrative examples of suitable dry etching processes that can be used in the present disclosure include reactive ion etching, ion beam etching, plasma etching or laser ablation. Typically, a reactive ion etching process or an ion beam etching process is used. The etching process first transfers the pattern from the patterned photoresist to the hard mask 20 and thereafter to the underlying semiconductor layer 18. The patterned photoresist is typically, but not necessarily always, removed after the pattern has been transferred to the hard mask 20. A conventional resist stripping process is used to remove the patterned photoresist from the structure. Alternatively, the semiconductor fins 22, 22' can also be formed utilizing a conventional sidewall image transfer (SIT) process. In a typical SIT process, a spacer is formed on a dummy mandrel. The dummy mandrel is removed and the remaining spacer is used as a hard mask to etch the semiconductor fins. The spacer is then removed after the semiconductor fins have been formed.

In some embodiments (not shown herein), the hard mask 20 that remains atop the semiconductor fins 22, 22' can be removed. This particular embodiment allows for fabrication of a tri-gated fully depleted non-planar semiconductor device since the gate dielectric to be subsequently formed would be present on the sidewalls and top surface of each of the semiconductor fins 22, 22'. The removal of the remaining non-etched portion 20' of hard mask 20 can be achieved by performing a selective etching process or by utilizing a planarization process such as chemical mechanical planarization.

Figure 3:
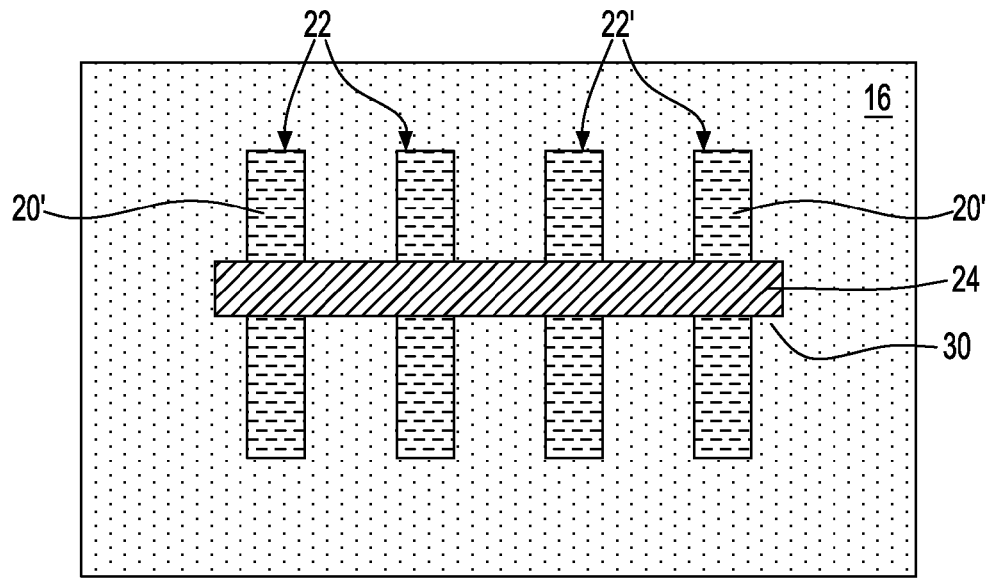
FIG. 3 is a pictorial representation (through a top-down view) depicting the initial structure of FIGS. 2A-2B after formation of a gate stack including a gate dielectric and a patterned gate electrode.

Referring now to FIG. 3, there is shown the structure of FIGS. 2A-2B after formation of a gate stack 24 which includes a gate dielectric located on exposed sidewalls of each semiconductor fin and an overlying patterned gate electrode; this step is labeled as step 104 in FIG. 10.

An optional interface layer of the gate stack 24 can be formed by a thermal growth process such as, for example, oxidation, nitridation or oxynitridation. Subsequently, the gate dielectric can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric of gate stack 24 may also be formed utilizing any combination of the above processes. In some embodiments, the gate dielectric material for semiconductor fins 22 is different from the gate dielectric material for semiconductor fins 22'. Different gate dielectric materials can be formed by utilizing block mask technology.

The gate dielectric of gate stack 24 is comprised of an insulating material having a dielectric constant of about 4.0 or greater. All dielectric constants mentioned herein are relative to a vacuum unless otherwise noted. In one embodiment, the gate dielectric of gate stack 24 comprises a high k material. The term "high k" denotes a dielectric having a dielectric constant of greater than 4.0, preferably greater than 7.0. Specifically, the gate dielectric of gate stack 24 that can be employed includes, but is not limited to, an oxide, nitride, oxynitride and/or silicate including metal silicates and nitrided metal silicates. In one embodiment, it is preferred that the gate dielectric of gate stack 24 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof. Highly preferred examples of gate dielectrics include $HfO_2$, hafnium silicate and hafnium silicon oxynitride. The physical thickness of the gate dielectric of gate stack 24 may vary, but typically, the gate dielectric has a thickness from 0.5 nm to 10 nm, with a thickness from 0.5 nm to about 3 nm being more typical.

A gate electrode material is then typically formed. The gate electrode material is comprised of a conductive material, including, for example, polySi, SiGe, a metal, a metal alloy, a metal silicide, a metal nitride, a metal carbide or combinations including multilayers thereof. When multilayers are present, a diffusion barrier (not shown), such as TiN or TaN, can be positioned between each of the conductive layers. In some embodiments, the gate electrode material for semiconductor fins 22 is different from the gate electrode material for semiconductor fins 22'. Different gate electrode materials can be formed by utilizing block mask technology.

The gate electrode material is formed utilizing a conventional deposition process including, for example, chemical vapor deposition, plasma enhanced chemical vapor deposition, atomic layer deposition, sputtering, plating, evaporation and any other like deposition processes. In embodiments in which poly Si or SiGe are used as the gate electrode material, an in-situ deposition process can be used or alternatively deposition followed by ion implantation can be used. The thickness of the gate electrode material is not critical to the present disclosure. Typically, however, the thickness of the gate electrode material is from 50 nm to 200 nm.

The as-deposited gate electrode material is patterned by lithography and etching providing the patterned gate electrode. It is noted that the patterned gate electrode and hence gate stack 24 is oriented perpendicular to each of the parallel oriented semiconductor fins 22, 22'. The lithographic and etching processes employed in patterning the gate electrode material can be the same as those mentioned above for patterning the semiconductor fins 22, 22'.

In some embodiment, each gate stack 24 also includes a hard mask (not shown) atop the gate electrode. The hard mask used in such an embodiment can be the same or different from the hard mask 20 described above.

Figure 4:
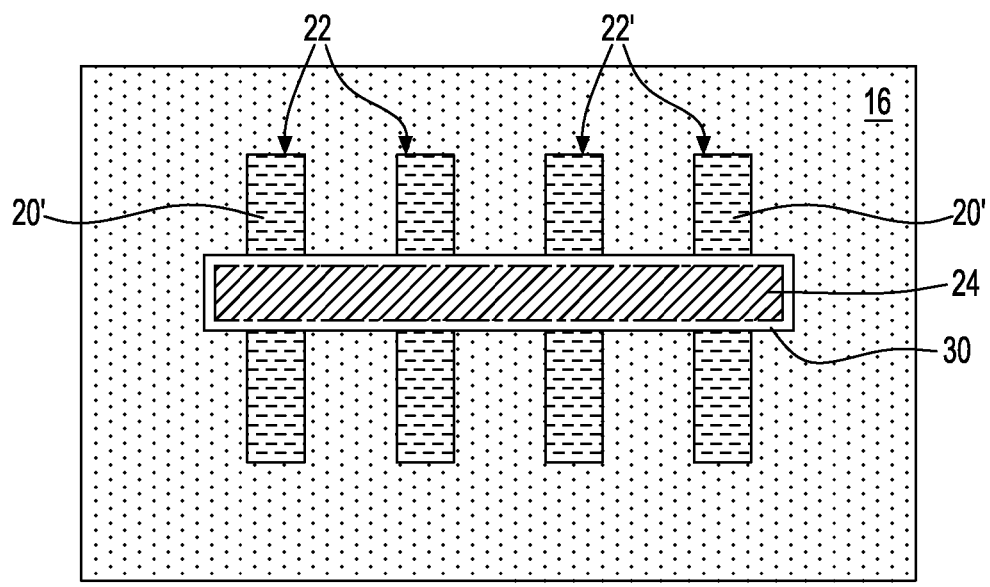
FIG. 4 is a pictorial representation (through a top-down view) depicting the structure of FIG. 3 after formation of a dielectric spacer on exposed sidewall surfaces of the gate stack.

Referring now to FIG. 4, there is shown the structure of FIG. 3 after forming a dielectric spacer 30 on exposed sidewall surfaces of the gate stack 24; this step is labeled as 106 in FIG. 10. It is observed that the underlying gate stack 24 is shown in FIG. 4 for reference purposes only. The dielectric spacer 30 can be formed by first depositing a dielectric liner on all exposed surfaces of the gate stack and the fins. The dielectric liner is formed utilizing any conventional deposition process including, for example, chemical vapor deposition, plasma enhanced chemical vapor deposition, atomic layer deposition, evaporation or chemical solution deposition. Alternatively, a thermal growth process including oxidation and/or nitridation can be employed in forming dielectric liner. Following the formation of the dielectric liner, the dielectric liner is etched to form the dielectric spacer 30 shown in FIG. 4. The etching of the dielectric may be performed utilizing any dry etching process such as, for example, reactive ion etching.

Dielectric spacer 30 includes any dielectric material such as, for example, an oxide, a nitride and/or an oxynitride. In one embodiment, the dielectric spacer 30 is a nitride such as, for example, silicon nitride.

After forming the dielectric spacer 30 on sidewall surfaces of the gate stack 24, source/drain extension regions are formed into the exposed portions of each semiconductor fin 22, 22' utilizing a conventional source/drain extension doping or ion implantation process, this step is labeled as step 108 in FIG. 10. For clarity, the source/drain extension regions are not however shown in the drawings of the present disclosure.

Figure 5:
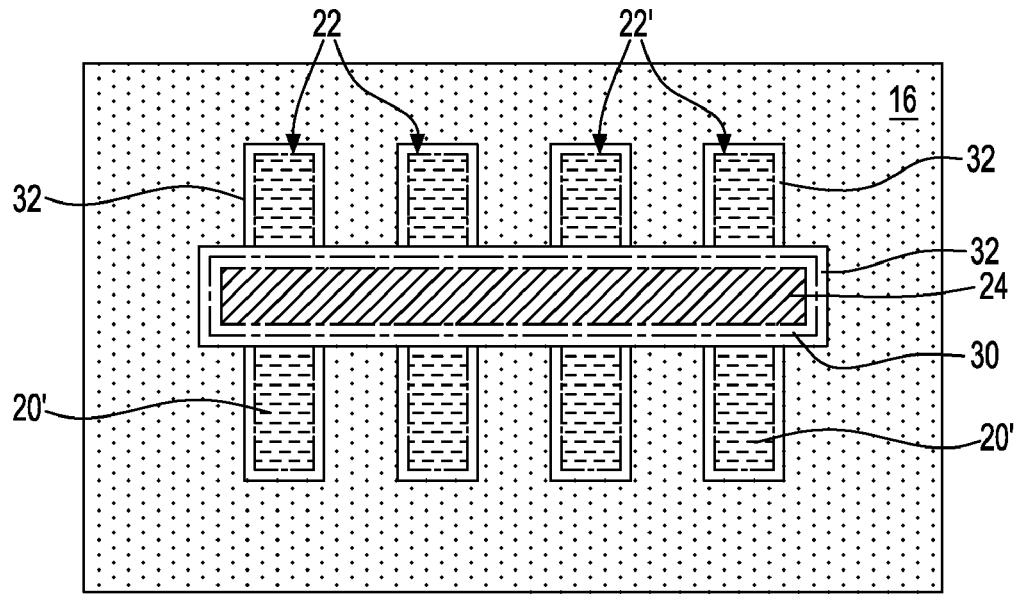
FIG. 5 is a pictorial representation (through a top-down view) depicting the structure of FIG. 4 after forming a sacrificial dielectric liner that conformally warps around each of the semiconductor fins and the gate stack.
Figure 13:
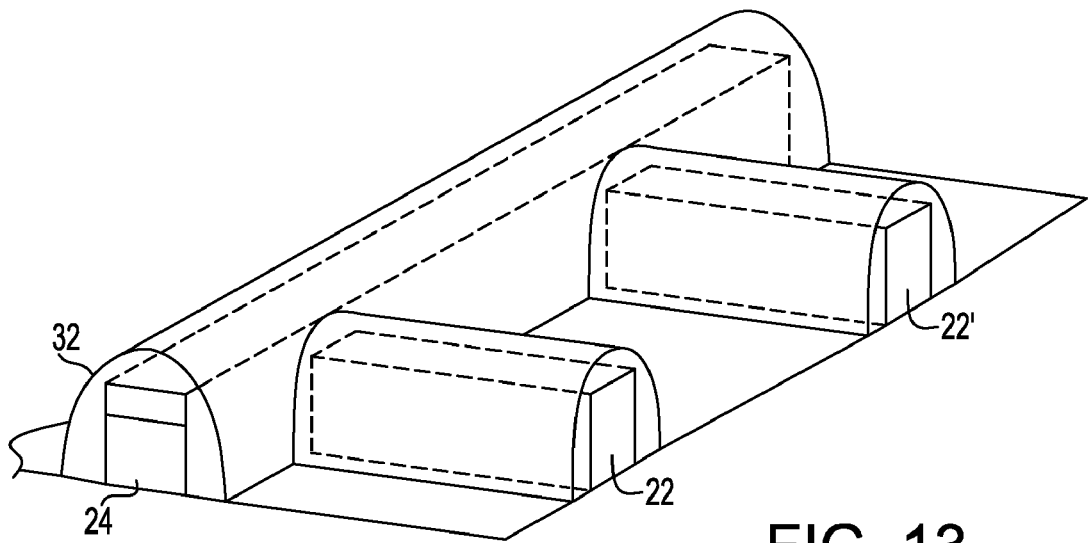
FIG. 13 is an isometric view of a portion of the structure shown in FIG. 5.

Referring now to FIG. 5 and the isometric view shown in FIG. 13, there is illustrated the structure of FIG. 4 after forming a sacrificial dielectric liner 32 that conformally wraps around the gate stack 24 and each of the semiconductor fins 22, 22'; this step is labeled as step 110 in FIG. 10. It is observed that the underlying gate stack 24, remaining non-etched portion 20' of hard mask 20 of each semiconductor fin and dielectric spacer 30 are shown in FIG. 5 for reference purposes only. Sacrificial dielectric liner 32 can be formed utilizing any conventional deposition process including, for example, chemical vapor deposition, plasma enhanced chemical vapor deposition, atomic layer deposition, evaporation or chemical solution deposition. Alternatively, a thermal growth process including oxidation and/or nitridation can be employed in forming the sacrificial dielectric liner 32.

Sacrificial dielectric liner 32 includes any dielectric material such as, for example, an oxide, a nitride and/or an oxynitride, which is different from the dielectric material used in forming dielectric liner 30. In one embodiment, and when the dielectric spacer 30 is a nitride such as, for example, silicon nitride, the sacrificial dielectric liner 32 is an oxide, such as, for example, silicon oxide. The thickness of the sacrificial dielectric liner 32 that is formed may vary depending upon the technique that was employed in forming the same as well as the type of dielectric material employed as liner 32.

It is noted that the formation of the dielectric spacer 30 and the sacrificial dielectric liner 32 encapsulates the gate stack 26 as well as portions of the semiconductor fin in which the source/drain regions will be subsequently formed.

Figure 6:
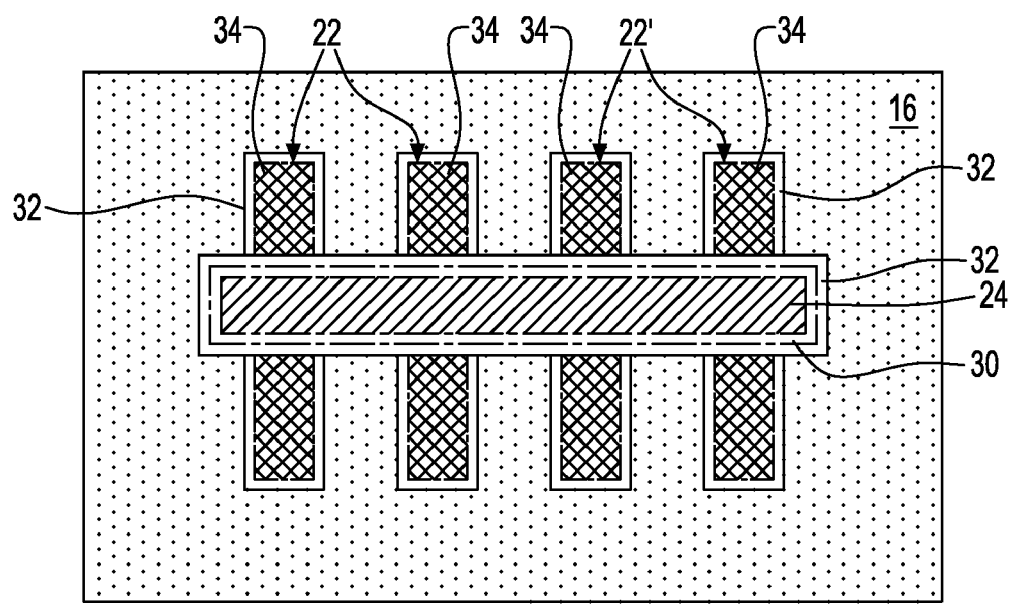
FIG. 6 is a pictorial representation (through a top-down view) illustrating the structure of FIG. 5 after performing an amorphizing ion implantation step.
Figure 14:
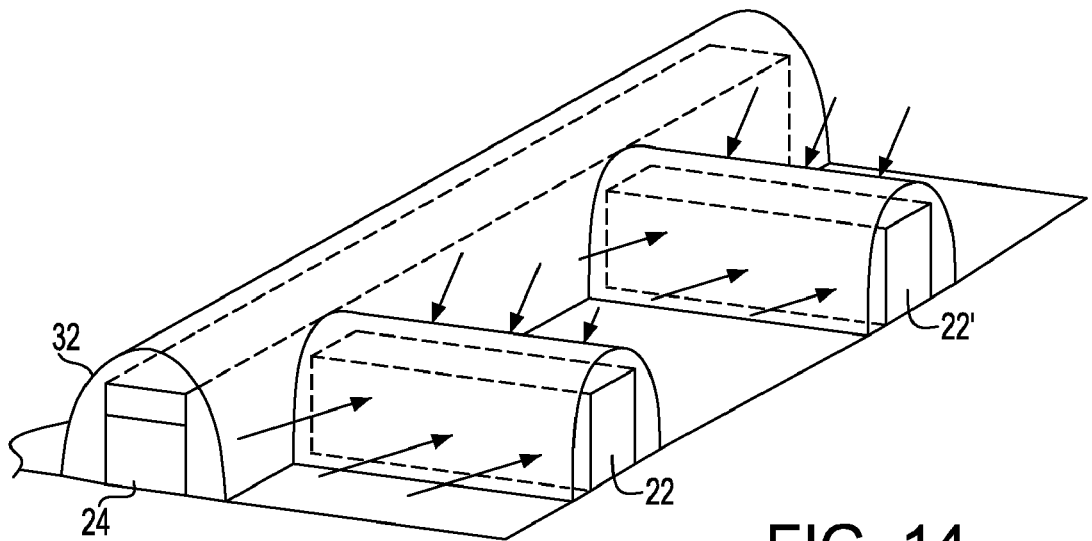
FIG. 14 is an isometric view of the structure shown in FIG. 13 during the amorphization ion implantation step.

Referring to FIG. 6, there is illustrated the structure of FIG. 5 after performing an amorphizing ion implant step; this step is labeled as step 112 in FIG. 10. FIG. 14 shows an isometric view of a portion of the structure shown in FIG. 5 during the amorphization ion implant step. The amorphizing ion implant step causes portions of the semiconductor fins that lay adjacent to the gate stack 24 (and that are not protected by the dielectric spacer 30) to have a disoriented crystal structure as compared with the crystal structure of the portions of the semiconductor fins that are protected by the gate stack 24 and the dielectric spacer 30. That is, the amorphizing ion implantation step causes portions of the semiconductor fins adjacent the gate stack, typically the source/drain regions, to become amorphized. The regions of the semiconductor fin having the disoriented crystal structure are labeled as regions 34 in the drawings (the remaining non-etched 20' of the hard mask 20 has been removed from this drawing to show the area of the semiconductor fin that becomes amorphized).

The amorphizing ion implant step that is performed includes implanting an amorphizing ion in sidewall portions of the semiconductor fins that are not protected by gate stack 24 and the dielectric spacer 30 using a tilt angle from 2° to 30°, with a tilt angle from 8° to 15° being more typical. The amorphizing ion is any atom that is heavier than the atoms present in the semiconductor fins. Typically, the amorphizing ions that can be employed include, but are not limited to, Xe, Ar, Ge, Ga and mixtures thereof. In one embodiment, Xe or Ar amorphizing ions are employed. The dose of the amorphizing ions that are implanted may vary depending on the type of amorphizing ion employed. Typically, the dose of the amorphizing ion that can be implanted is from 1e18 to 1e22 dopant atoms per cubic centimeter.

Figure 7:
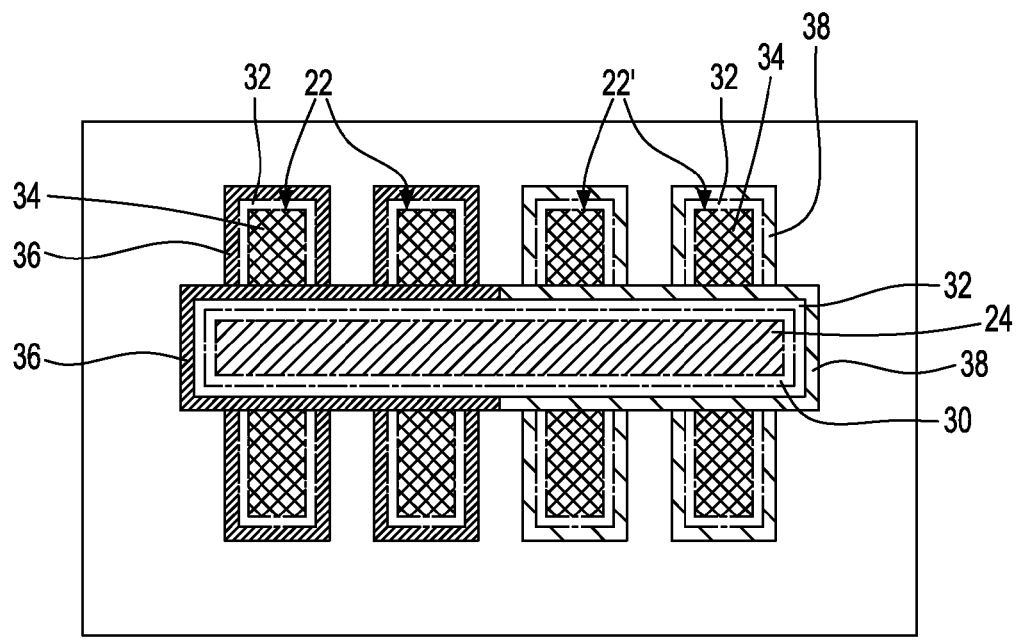
FIG. 7 is a pictorial representation (through a top-down view) illustrating the structure of FIG. 6 after dual stress liner formation.
Figure 15:
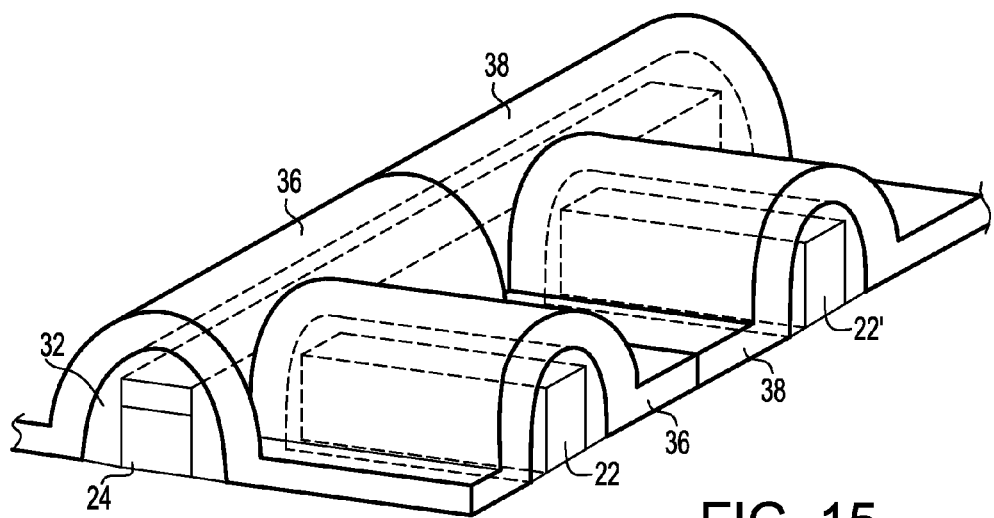
FIG. 15 is an isometric view of a portion of the structure shown in FIG. 7.

Referring now to FIG. 7 and FIG. 15, there is illustrated the structure of FIG. 6 after dual stress liner formation; this step is referenced as step 114 in FIG. 10. It is observed that the gate stack 24, dielectric spacer 30, amorphized region 34 of each semiconductor fin and the sacrificial liner 32 are shown in FIG. 7 for reference purposes only. Although patterned dual stress liners are shown in depicted in the drawings, the present disclosure also can be employed when a single stress liner is employed. Referring back to the embodiment shown in FIG. 7, the dual stress liner formation includes forming a first stress inducing film on the surface of the structure shown in FIG. 6. The first stress inducing film can be either a compressive stress inducing film which induces a compressive stress on p-channel devices or a tensile stress inducing film that induces a tensile stress on n-channel devices.

The tensile stress inducing film employed is typically a dielectric film that generates tensile stress on underlying structures. For example and in one embodiment, the tensile stress inducing film can be a tensile silicon nitride film. The tensile stress inducing film can be formed by plasma enhanced chemical vapor deposition (PECVD) or high density plasma chemical vapor deposition (HDPCVD) at a temperature ranging from 400° C. to 600° C.

Compressive stress inducing films that can be employed include a dielectric material that generates a compressive stress on an underlying structure, a refractory metal nitride such as, for example, TaN, TiN, WN, MoN, NbN, ReN, or a combination thereof. In some embodiments, the compressive stress inducing film is a comprised of a compressive nitride. The compressive stress inducing film can be formed by chemical vapor deposition (CVD), physical vapor deposition (PVD), plasma enhanced chemical vapor deposition (PECVD) or high density plasma chemical vapor deposition (HDPCVD).

After forming the first stress inducing film, a block mask is formed over one of the pfinFET region or the nfinFET region and then an etching process such as a dry etching is employed to remove the first stress inducing film from the finFET region not protected by the block mask. The etching step stops on an upper surface of the sacrificial dielectric liner 32. The block mask is removed by utilizing a stripping process, and then a second stress inducing film of the opposite stress generating type is formed over both the pfinFET and the nfinFET. A second block mask is formed over the finFET region not including the first stress generating film, and thereafter the second stress generating film that is formed atop the first stress generating film in one of the finFET regions is typically removed by etching, stopping atop the first stress generating film. Typically, exposed portions of the second stress generating film not protected by the second block mask are removed by dry etching. The second block mask is then removed by utilizing a conventional stripping process. In FIG. 7, reference numeral 36 denotes a patterned compressive stress inducing liner, while reference numeral 38 denotes a patterned tensile stress generating liner.

Figure 8:
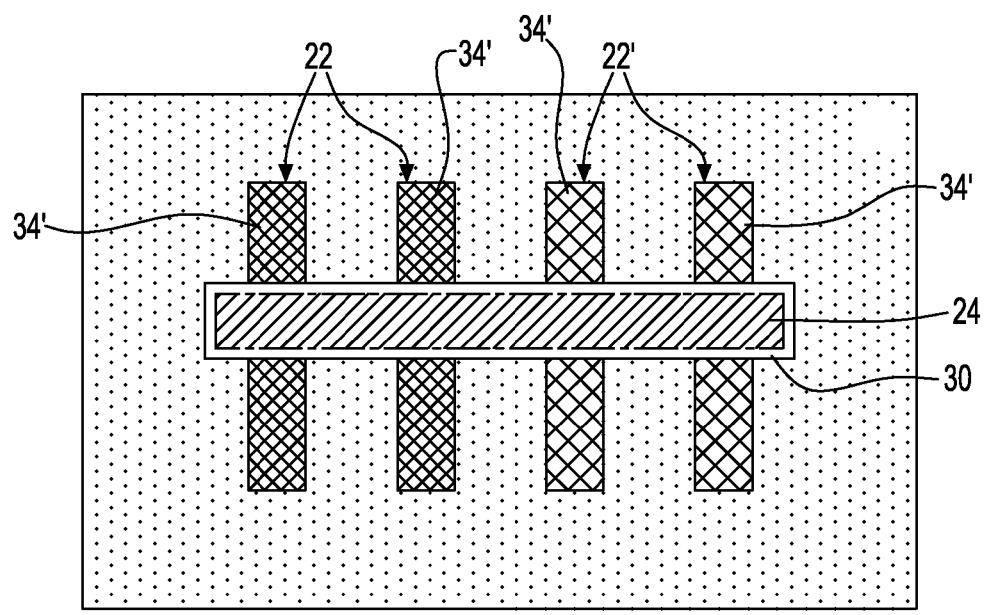
FIG. 8 is a pictorial representations (through a top-down view) illustrating the structure of FIG. 7 after performing a stress memorization, i.e., stress latching anneal, and removal of the dual stress liner and the sacrificial dielectric liner.
Figure 16:
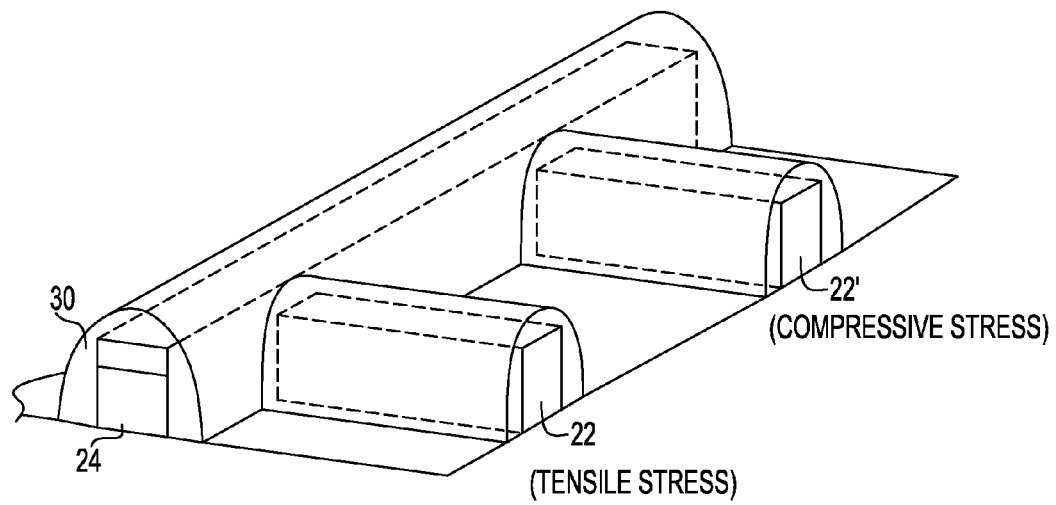
FIG. 16 is an isometric view of a portion of the structure shown in FIG. 8 after stress memorization.
Figure 17:
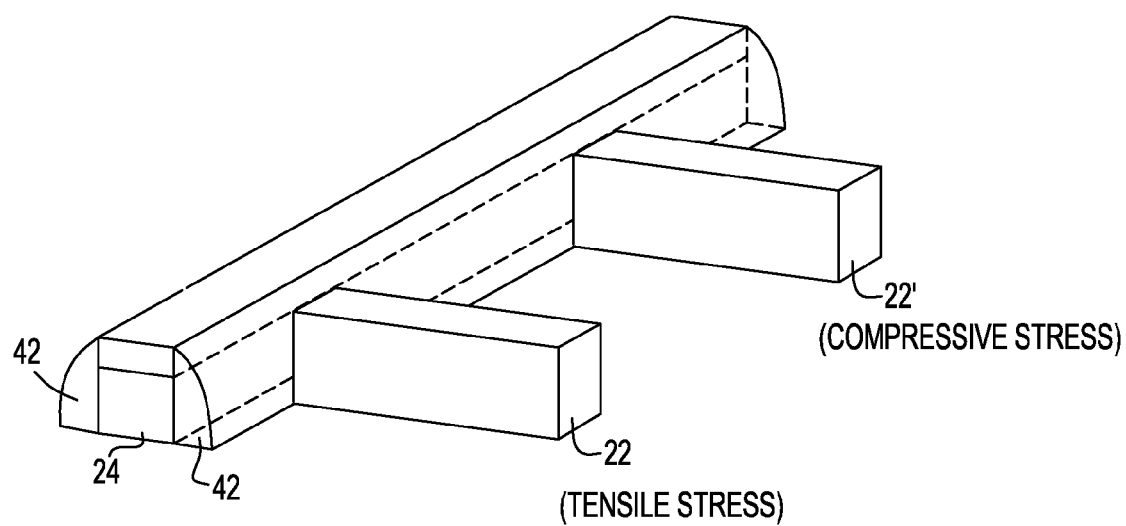
FIG. 17 is an isometric view of a portion of the structure shown in FIG. 8 after removing the dual stress liner and sacrificial dielectric liner.

Referring now to FIG. 8 and FIGS. 16 and 17, there are shown the structure of FIG. 7 after performing stress memorization, i.e., a stress latching anneal, and removal of the dual stress liners 36, 38 and the sacrificial dielectric liner 32; the anneal step is labeled as step 116 in FIG. 10 and the removal of the dual stress liners and the sacrificial dielectric liner is labeled as step 118 in FIG. 10. It is noted that in the embodiment illustrated, the stress latching anneal also activates the source/drain extension dopants that were previously implanted into exposed portions of the semiconductor fins.

The stress latching anneal is performed at a high temperature to induce "memorization" of stress by the semiconductor structures underneath the stress inducing liners. Typically during the stress latching anneal, the structures of the pfinFETs and the nfinFETs, which are under stress, are stabilized and the built-in stress is permanently transferred into the underlying pfinFETs and the nfinFETs, including the pfinFET channel and the nfinFET channel.

The anneal may be performed at a temperature ranging from 500° C. to 1000° C., with a temperature ranging from 600° C. to 800° C. being more typical. In one embodiment, the stress latching annealing is a rapid thermal anneal in which the duration of the rapid thermal anneal is typically from 5 seconds to 2 minutes. Other types of anneal processes can also be employed so long as they are capable of stress latching. It is also noted that during this anneal, the regions having the disoriented crystal structure, i.e., regions 34, that can be located beneath the patterned hard mask 20 are recrystallized (by solid phase epitaxial regrowth) back to their original crystal structure. The recrystallized regions are labeled as 34' in the drawings.

After performing the stress latching annealing, the patterned compressive stress inducing liner 36, the patterned tensile stress inducing liner 38, and the sacrificial dielectric liner 32 are removed. Typically, the stress inducing liners are removed utilizing one or more etching steps including dry etching and/or chemical wet etching. The stress inducing liners can be removed simultaneously, or one of the stress inducing liners can be removed first, followed by the other stress inducing liner. In one embodiment, etching in hot phosphoric acid is employed to simultaneously remove both the stress inducing liners from the structure.

Following the removal of the stress inducing liners, the underlying sacrificial dielectric liner 32 is typically removed by etching. The etch employed in removing the underlying sacrificial dielectric liner 32 is thus selective in removing the sacrificial dielectric liner material as compared to the underlying dielectric spacer 30 or semiconducting fin. In one embodiment, etching in diluted hydrofluoric acid is employed. The resultant structure is shown in FIG. 8 and FIG. 17.

Figure 9:
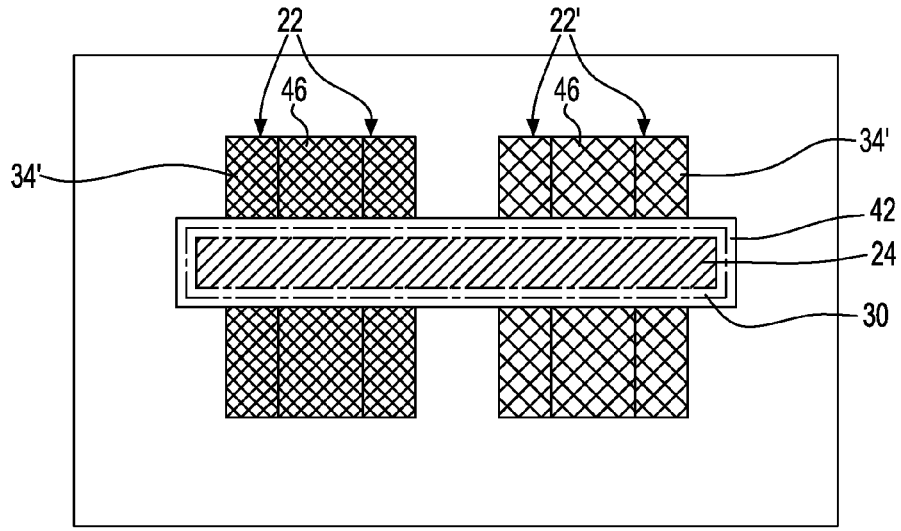
FIG. 9 is a pictorial representation (through a top-down view) illustrating the structure of FIG. 8 after merging of the semiconductor fins.

Referring now to FIG. 9, there is shown the structure of FIG. 8 after merging same conductivity type semiconductor fins together; this step is labeled as step 120 in FIG. 10. The merged fins are formed by epitaxially growing an epitaxial semiconductor layer 46 on the source/drain regions that merges each of the parallel oriented semiconductor fins. The lateral thickness of the fully grown epitaxial semiconductor layer varies and is dependent on the number of semiconductor fins within a given structure. It is noted that the thickness of the fully grown epitaxial semiconductor layer must merge (i.e., cover) each of the fins present in the structure. In the drawings, epitaxial semiconductor layer 46 would also extend atop region 34'.

After merging the semiconductor fins and as also illustrated in FIG. 9, an outer spacer 42 is formed around spacer dielectric 30; this step is labeled as step 122 in FIG. 10. The spacer material used in forming the outer spacer 42 can be the same or different, typically different, than the dielectric spacer 30. In one embodiment and when the dielectric spacer 30 comprises silicon nitride, the outer spacer material comprises silicon oxide. The outer spacer material can be formed utilizing one of the deposition techniques mentioned above for dielectric spacer 30. In one embodiment, the spacer material is formed utilizing a low pressure chemical vapor deposition process. After deposition of the outer spacer material, at least one etching step is employed to form outer spacer 42.

After forming the outer spacer 42, source/drain regions are formed into region 34' utilizing any conventional source/drain doping or ion implant step, followed by a conventional activation anneal. This step of the first embodiment is labeled as reference numeral 124 in FIG. 10.

The process flow described above provides a multi-gated fully depleted non-planar semiconductor device that includes a plurality of semiconductor fins located on a surface of a semiconductor substrate. A gate stack is located on a portion of each of the semiconductor fins, wherein the semiconductor fin located beneath the gate stack has a stress memorized channel region that has a first strained crystal structure. An epitaxial semiconductor layer is located on other portions of each of the semiconductor fins, wherein the semiconductor fins beneath the epitaxial semiconductor layer have a second strained crystal structure that is different from the first strained crystal structure. The second strained crystal structure is a result of the solid phase epitaxial regrowth mentioned above.

Figure 11:
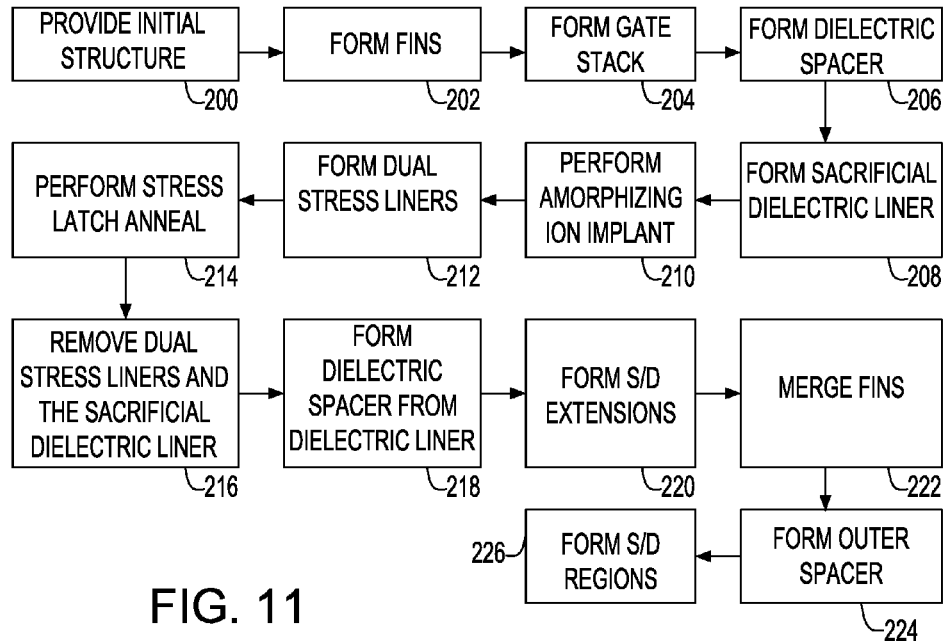
FIG. 11 is a flow diagram depicting the basic processing steps in accordance with a second embodiment of the present disclosure.

Reference is now made to FIG. 11 which illustrates a process flow diagram in accordance with a second embodiment. The second process flow includes a step 200 of providing an initial structure. Step 200 of the second embodiment is similar (in terms of materials and processing) to step 100 of the first embodiment. Next, a step 202 of forming semiconductor fins is performed. Step 202 of the second embodiment is similar (in terms of materials and processing) to step 102 described in the first embodiment. After performing step 202, a step 204 of forming a gate stack is performed. The step 204 of the second embodiment is similar (in terms of materials and processing) to step 104 described in the first embodiment.

The processing flow of the second embodiment continues by performing a step 206 of forming a dielectric liner. Step 206 of the second embodiment is similar (in terms of materials and processing minus etching of the dielectric liner material to form dielectric spacer 30) to step 106 of the first embodiment. After performing step 206, a step 208 of forming a sacrificial dielectric liner is performed. Step 208 of the second embodiment is similar (in terms of materials and processing) to step 110 of the first embodiment. After forming the sacrificial dielectric liner, i.e., performing step 208, a step 210 of performing an amorphizing ion implant is performed. Step 210 is similar (in terms of materials and processing) to step 112 of the first embodiment. Next, a step 212 of forming dual stress liners is performed. Step 212 of the second embodiment is similar (in terms of materials and processing) to step 114 of the first embodiment. After dual stress liner formation, a step 214 of performing a stress latching annealing is performed. Step 214 of the second embodiment is similar (in terms of processing) to step 116 of the first embodiment. After performing step 214, a step 216 of removing the dual stress liners and removing the sacrificial dielectric liner is performed. Step 216 of the second embodiment is similar (in terms of materials and processing) to step 118 of the first embodiment. Next, a step 218 of forming dielectric spacer 30 from the previously formed dielectric liner is performed. Step 218 of the second embodiment includes etching, such as reactive ion etching, which is described in the first embodiment for forming the dielectric spacer 30. After etching the dielectric liner into dielectric spacer 30, source/drain extension regions are formed (step 220) and merging of the semiconductor fins is performed (step 222). Step 220 of the second embodiment is similar (in terms of materials and processing) to step 108 of the first embodiment, while step 222 is similar (in terms of material and processing) to step 120 of the first embodiment. After merging the semiconductor fins, outer spacer is formed (step 224) and thereafter source/drain regions are formed (Step 226). Step 224 is the same (in terms of materials and processing) as step 122 of the first embodiment, and step 226 is the same (in terms of materials and processing as step 124 of the first embodiment.

Figure 12:
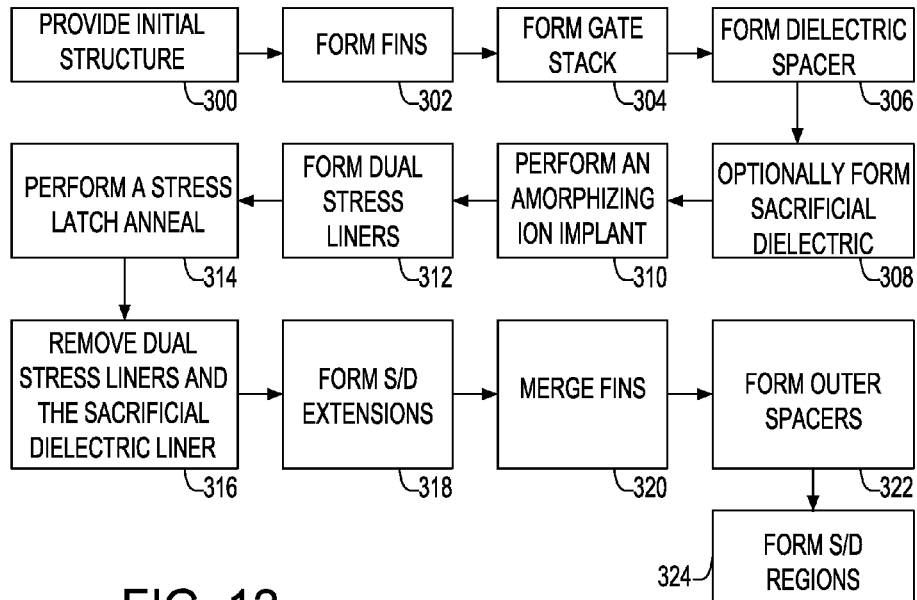
FIG. 12 is a flow diagram depicting the basic processing steps in accordance with a third embodiment of the present disclosure.

Reference is now made to FIG. 12 which illustrates a process flow diagram in accordance with a third embodiment of the present disclosure. The third process flow includes a step 300 of providing an initial structure. Step 300 of the third embodiment is similar (in terms of materials and processing) to step 100 of the first embodiment. Next, a step 302 of forming semiconductor fins is performed. Step 302 of the third embodiment is similar (in terms of materials and processing) to step 102 described in the first embodiment. After performing step 302, a step 304 of forming a gate stack is performed. The step 304 of the third embodiment is similar (in terms of materials and processing) to step 104 described in the first embodiment.

The processing flow of the third embodiment continues by performing a step 306 of forming a dielectric spacer. Step 306 of the third embodiment is similar (in terms of materials and processing) to step 106 of the first embodiment. After forming the dielectric spacer, a step 308 of forming a sacrificial dielectric liner may be performed. Step 308 of the third embodiment is similar (in terms of materials and processing) to step 110 of the first embodiment. In some embodiments step 308 may be omitted. Next, a step 310 of performing an amorphizing ion implant is performed. Step 310 of the third embodiment is similar (in terms materials and processing) to step 112 of the first embodiment. Next, a step 312 of forming dual stress liners is performed. Step 312 of the third embodiment is similar (in terms of materials and processing) to step 114 of the first embodiment. After dual stress liner formation, a step 314 of performing a stress latching annealing is performed. Step 314 of the third embodiment is similar (in terms of processing) to step 116 of the first embodiment. After performing step 314, a step 316 of removing the dual stress liners and removing the sacrificial dielectric liner is performed. Step 316 of the third embodiment is similar (in terms of materials and processing) to step 118 of the first embodiment. After removing the dual stress liners and sacrificial dielectric liner, step 318 of forming source/drain extension regions is performed. Step 318 is similar (in terms of materials and processing) as step 108 of the first embodiment. Next, a step 320 of merging of the semiconductor fins is performed. Step 320 of the third embodiment includes processing details for merging the fins in step 120 of the first embodiment. After merging the fins, a step 322 of forming an outer spacer is performed. Step 322 of the third embodiment is similar (in terms of materials and processing) to step 122 of the first embodiment. After forming the outer spacer, step 324 of forming source/drain regions is performed. Step 324 of the third embodiment is similar (in terms of materials and processing) as step 124 of the first embodiment.

It is noted that each of the processing flows depicted in FIGS. 11-12 provides a multi-gated fully depleted non-planar semiconductor device that includes a plurality of semiconductor fins located on a surface of a semiconductor substrate. A gate stack is located on a portion of each of the semiconductor fins, wherein the semiconductor fin located beneath stack has a stress memorized channel region that has a first lattice constant. An epitaxial semiconductor layer located on other portions of each of the semiconductor fins, wherein the semiconductor fins beneath the epitaxial semiconductor layer has a second lattice constant that is different from the first lattice constant.

It is observed that although the present disclosure describes and illustrates three different embodiments, the present disclosure also contemplates other embodiments in which a combination of the first, second and/or third embodiments can be performed. That is, the present disclosure contemplates combining the first and second embodiments, the first and third embodiments, the second and third embodiments, the first, second and third, etc.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a fully depleted non-planar semiconductor structure comprising:
    forming a plurality of parallel oriented semiconducting fins on a surface of a semiconductor substrate, wherein a gate stack is located on a portion of each of the semiconductor fins;
    forming at least one liner on at least an upper surface of the gate stack, wherein the at least one liner encapsulating underlying portions of each of the semiconductor fins;
    performing an amorphizing ion implantation process, wherein portions of each of the semiconductor fins adjacent to the gate stack have a disoriented crystal structure after performing the amorphizing ion implantation process;
    forming at least one stress inducing liner atop the at least one liner, wherein the at least one stress inducing liner imparts a stress to a channel region of each of the semiconductor fins that is located beneath the gate stack;
    performing a stress latching annealing, wherein the stress imparted to the channel region of each semiconductor fins is permanently transferred to the channel region of each semiconductor fins, while simultaneously recrystallizing the disoriented crystal structure in portions of each of the semiconductor fins;
    removing the at least the one stress inducing liner; and
    merging the recrystallized portions of each of the semiconductor fins, wherein said merging the recrystallized portions of each of the semiconductor fins comprises epitaxially growth of a semiconductor layer.

2. The method of claim 1 wherein the amorphizing ion implantation process includes implanting amorphizing ions into sidewalls of each of the semiconductor fins that are adjacent to the gate stack utilizing a tilt angle from 2° to 30°.

3. The method of claim 2 wherein the amorphizing ion includes Xe, Ar, Ge, Ga or mixtures thereof.

4. The method of claim 1 wherein said at least one stress liner is a compressive stress inducing liner, or a tensile stress including liner.

5. The method of claim 1 wherein the forming the at least one stress liner includes providing a patterned compressive stress inducing liner on some of the semiconductor fins and providing a patterned tensile stress inducing liner on other of the semiconductor fins.

6. The method of claim 1 wherein said stress latching annealing is performed at a temperature from 500° C. to 1000° C.

7. The method of claim 1 further comprising forming source/drain extension regions within portions of the semiconductor fin prior to said amorphizing anneal.

8. The method of claim 1 wherein the forming the plurality of parallel oriented semiconducting fins includes providing a semiconductor substrate having a hard mask located on an upper surface thereof; and patterning the semiconductor substrate includes lithography and etching or by a sidewall image transfer process.

9. The method of claim 8 wherein said hard mask is removed after patterning the semiconductor substrate.

10. The method of claim 1 further comprising forming a dielectric spacer on sidewall surfaces of the gate stack prior to forming said at least one liner.

11. The method of claim 1 further comprising forming source/drain extension regions in portions of each of the semiconductor fins after performing the stress latching annealing.

12. The method of claim 1 further comprising forming doped non-activated source/drain extension regions in portions of each of the semiconductor fins prior to performing the amorphizing ion implantation process, wherein during the stress latching annealing the doped non-activated source/drain extension regions are activated.

13. The method of claim 1 further comprising forming outer spacers on sidewall surfaces of the gate stack after merging the semiconductor fins.

14. The method of claim 13 further comprising forming source/drain regions after formation of said outer spacers.

15. A method of forming a fully depleted non-planar semiconductor structure comprising:
    forming a plurality of parallel oriented semiconducting fins on a surface of a semiconductor substrate, wherein a gate stack is located on a portion of each of the semiconductor fins;
    forming a dielectric spacer on sidewall surfaces of the gate stack;

forming a sacrificial dielectric liner conformally wrapping around the gate stack and each semiconductor fin;

performing an amorphizing ion implantation process, wherein portions of each of the semiconductor fins adjacent to the gate stack have a disoriented crystal structure after performing the amorphizing ion implantation process;

forming at least one stress inducing liner atop the at least one liner, wherein the at least one stress inducing liner imparts a stress to a channel region of each of the semiconductor fins that is located beneath the gate stack;

performing a stress latching annealing, wherein the stress imparted to the channel region of each semiconductor fins is permanently transferred to the channel region of each semiconductor fins, while simultaneously recrystallizing the disoriented crystal structure in portions of each of the semiconductor fins;

removing the at least the one stress inducing liner and the sacrificial dielectric liner; and merging the recrystallized portions of each of the semiconductor fins, wherein said merging the recrystallized portions of each of the semiconductor fins comprises epitaxially growth of a semiconductor layer.

16. A method of fabricating a fully depleted non-planar semiconductor structure comprising:

forming a plurality of parallel oriented semiconducting fins on a surface of a semiconductor substrate, wherein a gate stack is located on a portion of each of the semiconductor fins;

forming at least one liner on at least an upper surface of the gate stack, wherein the at least one liner encapsulating underlying portions of each of the semiconductor fins;

performing an amorphizing ion implantation process, wherein portions of each of the semiconductor fins adjacent to the gate stack have a disoriented crystal structure after performing the amorphizing ion implantation process;

forming at least one stress inducing liner atop the at least one liner, wherein the at least one stress inducing liner imparts a stress to a channel region of each of the semiconductor fins that is located beneath the gate stack;

performing a stress latching annealing, wherein the stress imparted to the channel region of each semiconductor fins is permanently transferred to the channel region of each semiconductor fins, while simultaneously recrystallizing the disoriented crystal structure in portions of each of the semiconductor fins;

removing the at least the one stress inducing liner;

merging the recrystallized portions of each of the semiconductor fins; and forming outer spacers on sidewall surfaces of the gate stack after merging the semiconductor fins.

17. A method of fabricating a fully depleted non-planar semiconductor structure comprising:

forming a plurality of parallel oriented semiconducting fins on a surface of a semiconductor substrate, wherein a gate stack is located on a portion of each of the semiconductor fins;

forming at least one liner on at least an upper surface of the gate stack, wherein the at least one liner encapsulating underlying portions of each of the semiconductor fins;

performing an amorphizing ion implantation process, wherein portions of each of the semiconductor fins adjacent to the gate stack have a disoriented crystal structure after performing the amorphizing ion implantation process;

forming at least one stress inducing liner atop the at least one liner, wherein the at least one stress inducing liner imparts a stress to a channel region of each of the semiconductor fins that is located beneath the gate stack;

performing a stress latching annealing, wherein the stress imparted to the channel region of each semiconductor fins is permanently transferred to the channel region of each semiconductor fins, while simultaneously recrystallizing the disoriented crystal structure in portions of each of the semiconductor fins;

removing the at least the one stress inducing liner;

merging the recrystallized portions of each of the semiconductor fins;

forming outer spacers on sidewall surfaces of the gate stack after merging the semiconductor fins; and forming source/drain regions after formation of said outer spacers.

* * * * *